United States Patent
Savoye et al.

(10) Patent No.: US 8,662,438 B2
(45) Date of Patent: Mar. 4, 2014

(54) NAVIGATION ELECTRONIC CARD SUPPORT FOR A ROTARY WING DRONE

(75) Inventors: Guillaume Savoye, Paris (FR); Flavien Morra, Pantin (FR); Jean-Francois Vuillet, Versailles (FR)

(73) Assignee: Parrot, Paris (FR)

( * ) Notice: Subject to any disclaimer, the term of this patent is extended or adjusted under 35 U.S.C. 154(b) by 85 days.

(21) Appl. No.: 13/508,959

(22) PCT Filed: Oct. 15, 2010

(86) PCT No.: PCT/FR2010/052186
§ 371 (c)(1),
(2), (4) Date: Jun. 6, 2012

(87) PCT Pub. No.: WO2011/058255
PCT Pub. Date: May 19, 2011

(65) Prior Publication Data
US 2012/0234969 A1    Sep. 20, 2012

(30) Foreign Application Priority Data
Nov. 13, 2009  (FR) ..................... 09 58011

(51) Int. Cl.
*B64C 11/00* (2006.01)
(52) U.S. Cl.
USPC ............... 244/17.13; 244/17.11; 267/136
(58) Field of Classification Search
USPC ................. 244/17.13, 17.11, 17.23
See application file for complete search history.

(56) References Cited

U.S. PATENT DOCUMENTS

| | | | |
|---|---|---|---|
| 6,142,419 A | 11/2000 | Arlton et al. | |
| 6,688,936 B2 * | 2/2004 | Davis | 446/37 |
| 6,811,460 B1 * | 11/2004 | Tilbor et al. | 446/34 |
| 7,325,772 B1 * | 2/2008 | Hanewinkel et al. | 244/129.4 |
| 7,407,424 B2 * | 8/2008 | Choi | 446/37 |
| 2002/0106966 A1 * | 8/2002 | Jimenez et al. | 446/454 |
| 2002/0142699 A1 * | 10/2002 | Davis | 446/37 |
| 2004/0150144 A1 * | 8/2004 | Goepfert et al. | 267/136 |
| 2005/0061909 A1 | 3/2005 | Winston | |
| 2007/0105474 A1 * | 5/2007 | Gotou et al. | 446/37 |
| 2007/0117492 A1 * | 5/2007 | Sze et al. | 446/57 |
| 2007/0158887 A1 * | 7/2007 | Ogata | 267/136 |
| 2008/0210809 A1 * | 9/2008 | Arlton et al. | 244/17.11 |
| 2010/0120273 A1 * | 5/2010 | Lucero et al. | 439/79 |
| 2012/0056041 A1 * | 3/2012 | Rhee et al. | 244/4 R |
| 2012/0083945 A1 * | 4/2012 | Oakley et al. | 701/2 |

FOREIGN PATENT DOCUMENTS

EP    2028917 A2    8/2008

* cited by examiner

*Primary Examiner* — Christopher P Ellis
*Assistant Examiner* — Medhat Badawi
(74) *Attorney, Agent, or Firm* — Haverstock & Owens LLP

(57) ABSTRACT

The support (300) is intended to be fixed in a housing provided in the drone, through a mechanical interface (310) made of a material absorbing the mechanical vibrations. The mechanical interface, annular in shape, is intended to be attached to a corresponding annular shoulder provided in the housing. A fastening part (301) for fixing the support in the housing carries the mechanical interface (310), with at least one connection leg (302) supporting the navigation electronic card (320) and mounted free at one end on the fastening part. A battery (400) for the power supply of the drone is further accommodated in the support. The navigation electronic card may notably include a navigation sensor (321) such as an accelerometer, placed on the card in such a manner to be positioned at the barycenter of the drone.

15 Claims, 4 Drawing Sheets

NAVIGATION ELECTRONIC CARD SUPPORT FOR A ROTARY WING DRONE

The present invention relates to a navigation electronic card support for a rotary wing drone.

The invention finds a particularly advantageous application in the field of radio controlled toys that can be used by children, in particular in indoor environments, such as, for example, a room in a house or in a flat.

As used herein, "rotary wing drone" means all the known helicopter formulas, i.e. the conventional mono-rotor formula with anti-torque rotor, the banana-type twin-rotor tandem formula, the Kamof formula with counter-rotating coaxial rotors, and the quadricopter or quadrotor formula with four fixed-pitch rotors, etc.

In a drone of the quadricopter type, for example, the rotary wing is consisted of four propulsion groups, each comprising a propeller driven by an electric motor through a system for reducing the generally very high rotational speed of the motor.

The driving motor of each propulsion group includes an electronic card receiving control signals established, based on flight parameters, by a single navigation electronic card, common to the whole propulsion groups.

From a structural point of view, the functional elements that have just been presented are carried by a hull comprising four circular frames arranged together according to a square configuration, and at the centers of which are placed the propulsion groups.

The circular frames of the hull are organized around a central main structure in which is provided a housing intended to receive the navigation electronic card and the battery for supplying electric current to the propulsion group driving motors and to the associated control electronic card, as well as the navigation electronic card.

The propulsion groups located at the centers of the circular frames are mechanically connected to the main structure of the hull by tubes, for example made of carbon. The leads required for the electric connections between the driving motors, on the one hand, and the battery and the navigation electronic card, on the other hand, are placed inside carbon tubes. Finally, it is to be specified that the navigation electronic card of the drone includes a navigation sensor intended to provide information about the drone trajectory, speed, altitude, etc. The navigation sensor may be made of an inertial unit, an accelerometer, a rate gyro, etc.

The navigation electronic card being mechanically connected to the main structure of the drone, and the main structure being itself mechanically connected to the propulsion groups via the carbon tubes, it is to be understood that the navigation sensor, carried by the navigation electronic card, is not protected from the mechanical vibrations produced by the propulsion groups during the operation of the drone. Further, the navigation sensors are by nature very sensitive to vibrations. It results therefrom that sensor reading errors induced by the vibrations may lead to severe dysfunctions of the drone.

The US 2004/0150144 A1 describes a unit comprising a navigation electronic card and a support intended to be fixed in a housing. The support comprises a mechanical interface formed of isolators made of an elastomer material absorbing the mechanical vibrations.

This unit is however unsuited to a miniature drone such as a remote-controlled toy, subjected to mechanical vibrations, the filtering of which is difficult, taking into account the proximity between the propulsion groups and the navigation sensor to be protected.

To overcome this difficulty, it is possible to use a low-pass digital filter applied to the signal delivered downstream to the navigation sensor, so as to cancel therefrom the components due to the mechanical vibrations. However, such a processing has the drawback of being complex, delaying the taking into account of the drone movement and leading to a loss of relevant information due to the low-pass filtering.

Therefore, an object of the invention is to propose a navigation electronic card support that will permit to reduce, or even to cancel, the effects of the spurious vibrations generated by the propulsion groups on the operation of the navigation sensor, and this without the drawbacks linked to the presence of a low-pass filter.

This object is achieved, according to the invention, by a navigation support for a rotary wing drone of the general type disclosed in the above-mentioned US 2004/0150144 A1, i.e. comprising a navigation electronic card and a support for this electronic card, intended to be fixed in a housing. The support includes a mechanical interface with the housing, made of a material absorbing the mechanical vibrations.

The absorbing mechanical interface interposed between the navigation electronic card and the housing, provided notably in the main structure of the drone, permits to isolate the navigation sensor from the mechanical vibrations coming from the propulsion groups and received on the main structure of the drone.

Characteristically of the invention, the above-mentioned unit comprises: a fastening part for fixing the support in the housing, said fastening part carrying the mechanical interface, wherein the mechanical interface is annular in shape and is intended to be attached to a corresponding annular shoulder provided in the housing; at least one connection leg, carrying the navigation electronic card and mounted free at one end on the fastening part; and a battery for the power supply of the drone, accommodated in the support and fixed to the fastening part of the support in the housing.

Therefore, the navigation electronic card is hung up to the fastening part by at least one connection leg, without any direct mechanical contact with the vibration part of the drone. The only vibrations that could reach the navigation electronic card through the fastening part are cancelled by the absorbing mechanical interface.

Moreover, as the battery supplying the drone with an electric current is the heavier element of the system, it would be advantageous to use the inertia thereof by placing it in the hull at a place in which it can contribute to further limit the vibrations transmitted to the navigation electronic card. This way, the battery becomes a part of the anti-vibration system by limiting the not hanging dead weight.

Furthermore, it will be observed that the cancelling of spurious vibrations is performed upstream to the navigation sensor, so that the signal provided by the latter needs no specific processing downstream, such as a low-pass filtering, with all the drawbacks that are associated thereto.

It is also to be emphasized that the support according to the invention plays, regarding to the navigation electronic card, the role of a shock absorber when the drone lands, and avoids the wear, due to the vibrations, of the electric connectors placed on the navigation electronic card.

Advantageously, the navigation electronic card includes a navigation sensor placed on said card in such a manner to be positioned at the barycenter of the drone.

In this ideal position for the navigation sensor, it is possible to consider that said navigation sensor is an accelerometer, without the need to add a component for acquiring the inclination of the drone, such as a rate gyro for example. Indeed, an accelerometer placed at the barycenter of the drone can provide the same indications as a rate gyro, in particular the direction of the gravity (inclinometer function). The number of components dedicated to the navigation is thus reduced, as well as the cost thereof, an accelerometer being substantially cheaper than a rate gyro. Moreover, the angle measurement domain is not limited, unlike with a mechanical rate gyro that operates correctly over a range of ±30°, but that is no longer controllable beyond.

In an advantageous embodiment, the battery is fixed to said fastening part of the support by means of a hook and loop tape. This type of fixation through a hook and loop tape is very easy to handle compared to a screw fixation, for example. Moreover, it contributes to the reduction of vibrations and avoids the mechanical clearances liable to disturb the acceleration measurements.

In practice, the absorbing material may be a foam of thermosetting material, in particular a polyurethane foam.

Preferably, the absorbing material mechanical interface is fixed to the housing by bonding. This arrangement permits to obtain a better absorption of the shearing efforts applied to the support. The invention further provides that the absorbing material mechanical interface is fixed to the support in the same way, by bonding.

Finally, the invention also relates to a rotary wing drone comprising a navigation electronic card support as mentioned above.

An exemplary embodiment of the device of the invention will now be described, with reference to the appended drawings in which same reference numbers designate identical or functionally similar elements throughout the figures.

FIG. 2b is a transparency view of the drone main structure of FIG. 2a.

The following description, with respect to the appended drawings, given only by way of non-limitative examples, will permit to well understand in what the invention consists and how it can be implemented.

Figure 1:
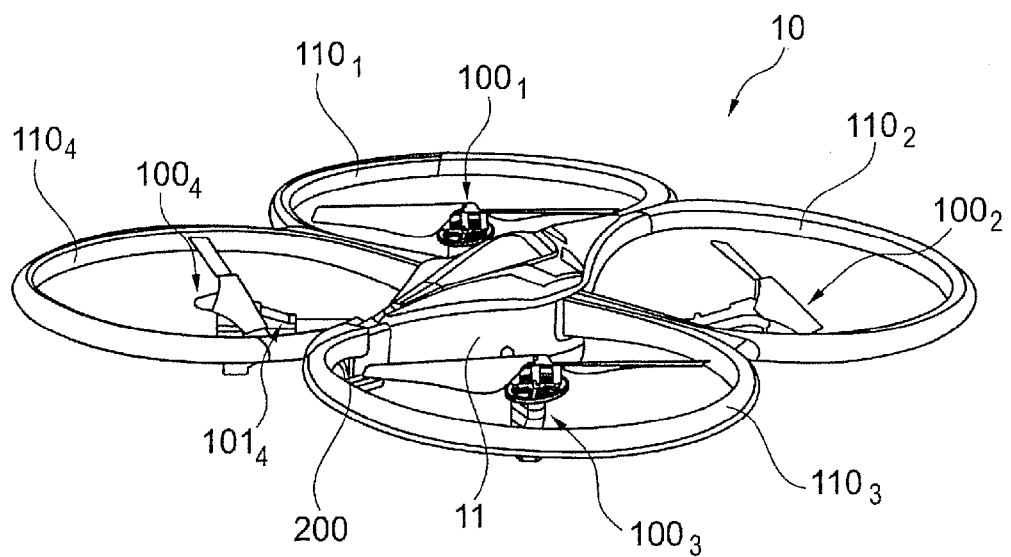
FIG. 1 is a perspective view of a rotary wing drone according to the invention.

In FIG. 1, a quadricopter 10 is shown, constituting a drone whose rotary wing is consisted of four coplanar propulsion groups $100_1$, $100_2$, $100_3$, $100_4$. Each propulsion group comprises a propeller coupled to a system for reducing the rotational speed of a driving electric motor.

The hull of the drone 10 is consisted of four circular frames $110_1$, $110_2$, $110_3$, $110_4$, made of expanded polypropylene, at the centers of which are placed the propulsion groups $100_1$, $100_2$, $100_3$, $100_4$. The circular frames are made integral with each other by means of a main structure 11 comprising, in particular, the navigation elements of the drone that will be describe in detail hereinafter.

As shown in FIG. 1, the circular frames are arranged according to a square configuration, so that a pick-up camera 200 can be installed the nearest possible to the center of the drone 10, which thus permit to reduce the moment of inertia of the camera and to shorten the electric connections between the camera and the main structure 11.

Figure 2A:
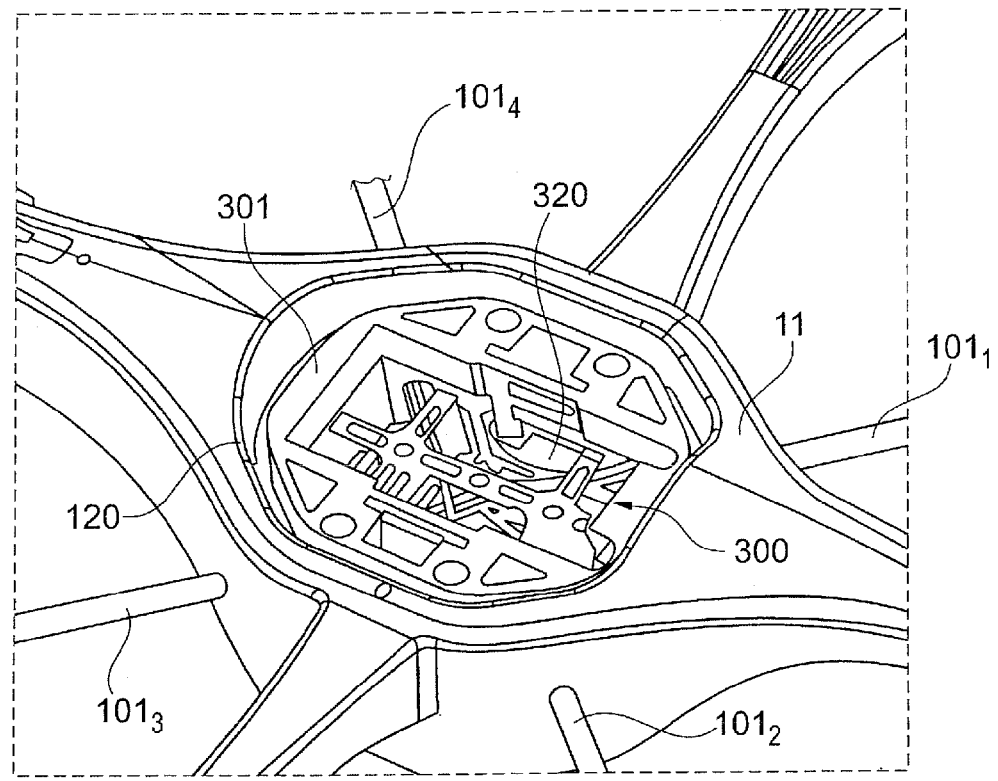
FIG. 2a is a perspective view of the main structure of the drone of FIG. 1, showing a navigation electronic card support according to the invention.

The propulsion groups $100_1$, $100_2$, $100_3$, $100_4$ are mechanically connected to the main structure 11 of the hull of the drone 10 by carbon tubes $101_1$, $101_2$, $101_3$, $101_4$, which can be best seen in FIG. 2a.

The carbon tubes $101_1$, $101_2$, $101_3$, $101_4$ also contain electric leads that extend between the central structure 11 of the hull and the driven motors of the propulsion groups. These leads permit to power supply the motor itself of each propulsion group, as well as the associated control circuit, according to a control signal provided, based on the flight parameters, by a navigation electronic card 320 accommodated in the main structure 11.

In FIGS. 2a, 2b, 3 and 4, it can be seen that the navigation electronic card 320 carrying a navigation sensor 321 of the accelerometer type, for example, is fastened to a support 300, which is arranged in a housing 120 provided in the main structure 11.

More precisely, the support 300 for the electronic card 320 is consisted of two parts, i.e. a fastening part 301 for fixing the support in the housing 120, and legs, referenced as a whole by 302, mounted free on the fastening part 301 at one end, the navigation electronic card 320 with the sensor 321 being hung up at another end of the legs 302.

The part 301 of the support 300 is fixed in the housing 120 through a mechanical interface 310 made of a material absorbing the mechanical vibrations, in particular a foam of thermosetting material, notably polyurethane. In the exemplary embodiment shown in the above-mentioned figures, the absorbing interface 310 carried by the fastening part 301 has an annular shape, so that it can be attached to a corresponding annular shoulder 121 provided in the housing 120, without being in mechanical contact with any other element of the housing and of the main structure 11.

Figure 2B:
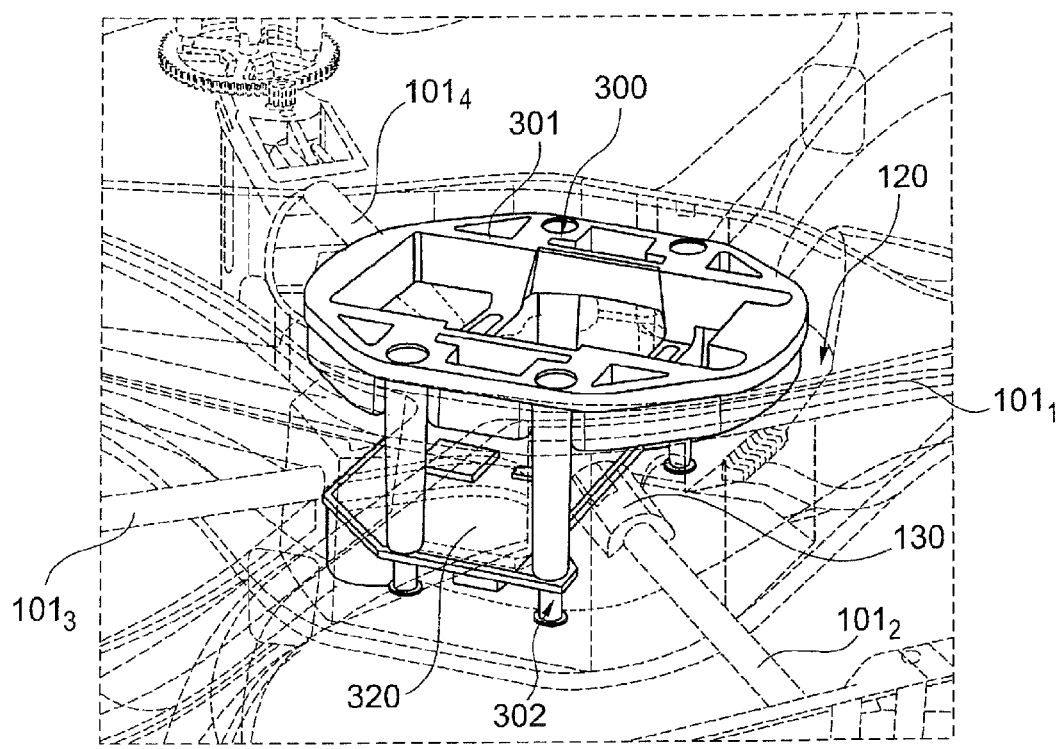
Figure 3:
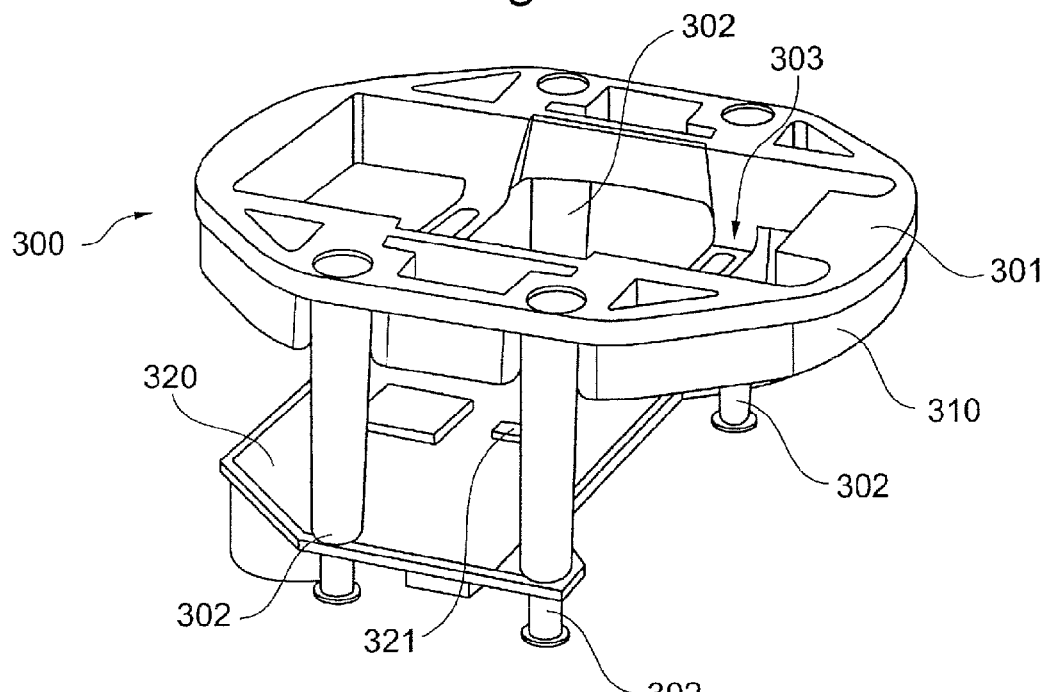
FIG. 3 is a perspective view of the navigation electronic card support of FIGS. 2a and 2b.

On the other hand, it can be observed in particular in FIG. 2b that the carbon tubes $101_1$, $101_2$, $101_3$, $101_4$ are made integral with each other by a cross-shaped connection part 130, without any mechanical contact with the support 300 of the navigation electronic card 320.

As a conclusion, the mechanical vibrations generated by the propulsion groups $100_1$, $100_2$, $100_3$, $100_4$ during the operation of the drone 10 are transmitted to the main structure 11 through the carbon tubes $101_1$, $101_2$, $101_3$, $101_4$, but cannot be transmitted to the support 300 because the only mechanical interface 310 between the main structure 11 and the support 300 is provided by the invention to absorb the vibrations. It results therefrom that the measurements provided by the navigation sensor 321 are not disturbed by the mechanical vibrations of the drone propulsion groups and that no dysfunction can occur on this account.

Preferably, the fastening part 301 is bonded to the polyurethane foam forming the mechanical interface 310. Likewise, the latter is bonded to the shoulder 121 of the housing 120. Therefore, a best resistance to the shearing efforts is obtained, and the navigation electronic card 320 is held in position in case of turning upside down of the drone 10. Furthermore, the navigation sensor 321 may be positioned on the navigation electronic card 320 so as to be placed at the gravity center of the drone 10. This arrangement permits to avoid the use of a rate gyro, for the benefit of an accelerometer, which is cheaper, because, in this privileged position, an accelerometer can also operate as an inclinometer to provide notably the direction of the gravity.

Figure 4:
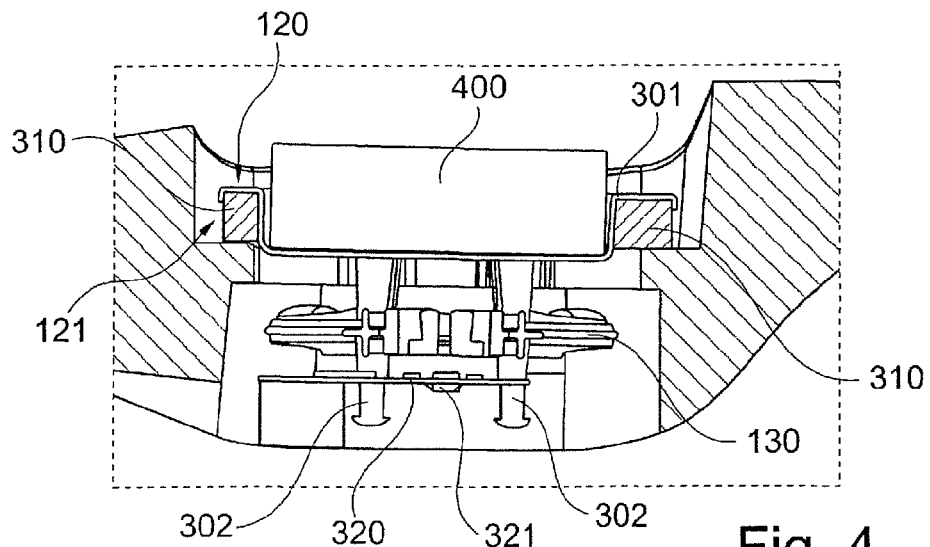
FIG. 4 is a cross-sectional view of the drone main structure of FIGS. 2a and 2b.
Figure 5A:
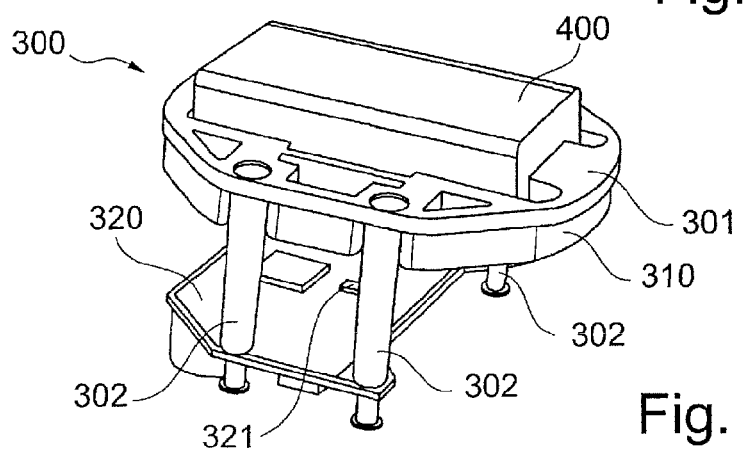
FIG. 5a is a perspective view of the navigation electronic card support of FIG. 3, equipped with an electric power supply.
Figure 5B:
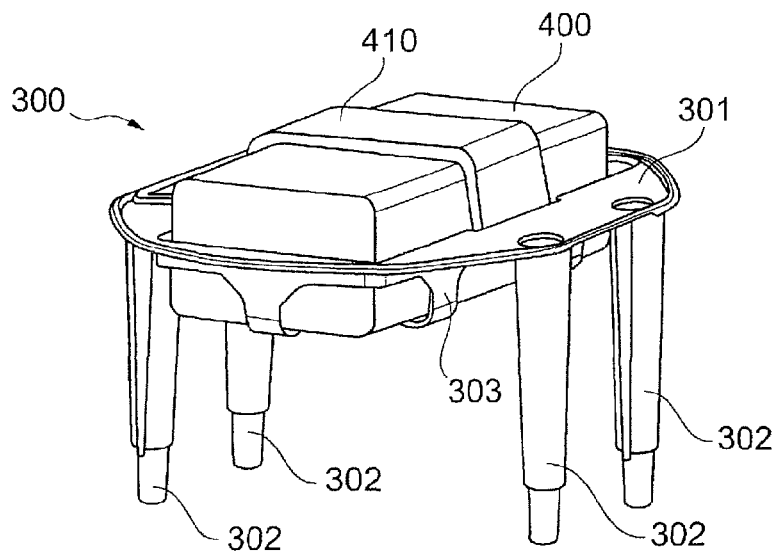
FIG. 5b is a perspective view of the navigation electronic card support of FIG. 5a, showing a hook-and-loop-tape battery fixation system.

FIGS. 4, 5*a* and 5*b* show that the support 300 of the navigation electronic card 320 also serves to accommodate the battery 400 of the drone 10. For that purpose, a cradle 303 is provided in the fastening part 301 to receive the battery 400. In this configuration, the inertia of the battery is added to that of the support 300 and, by limiting the not hanging dead weight, it also contributes to the absorption of the mechanical vibrations.

As illustrated in FIG. 5*b*, the battery 400 may be kept in position in the cradle 303 by means of a hook and loop tape 410. This mode of fixation is very simple to use and is free of mechanical clearances that could be at the origin of errors in the indications provided by the accelerometer 321.

Figure 6:
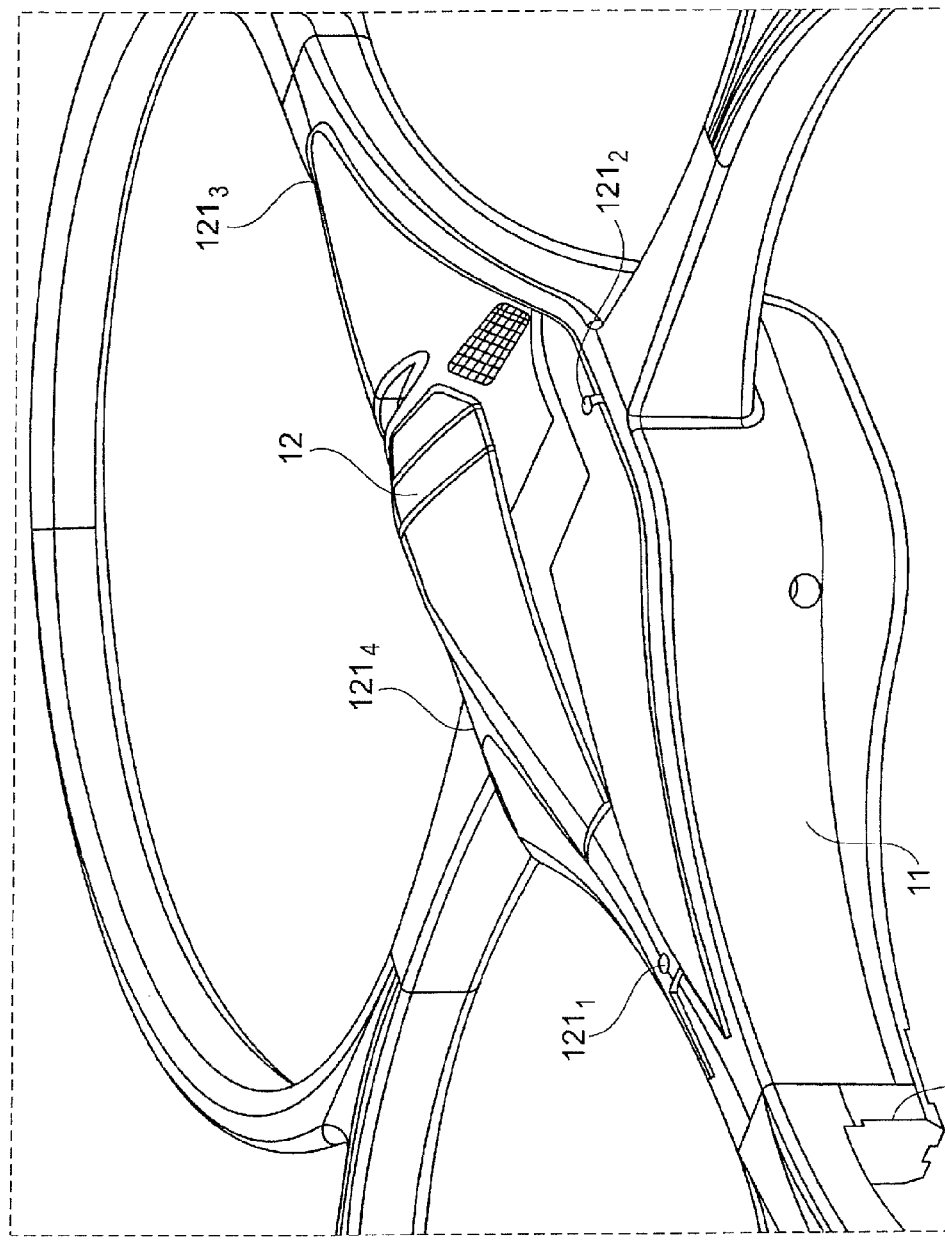
FIG. 6 is a partial perspective view of the drone of FIG. 1, showing a magnetic-fixation closing lid for the main structure.

Finally, FIG. 6 shows a drone 10, the housing of which containing the navigation electronic card support and the battery is closed by a protective lid 12 fixed to the main structure 11 by magnetic opening and closing means, such as permanent magnets 121₁, 121₂, 121₃, 121₄. This fixation system using magnets is of very fast and very simple use because it requires no particular tool, notably no screwdriver.

The invention claimed is:

1. A unit comprising:
   a navigation electronic card (320) for a rotary wing drone (10); and
   a support (300) for this electronic card, intended to be fixed in a housing (120) provided in the drone,
   the support comprising a mechanical interface with the housing, made of a material absorbing the mechanical vibrations,
   the unit being characterized in that it comprises:
   a fastening part (301) for fixing the support in the housing, said fastening part carrying the mechanical interface (310),
   wherein the mechanical interface is annular in shape and is intended to be attached to a corresponding annular shoulder (121) provided in the housing;
   at least one connection leg (302), carrying the navigation electronic card and mounted free at one end on the fastening part; and
   a battery (400) for the power supply of the drone, accommodated in the support (300) and fixed to the fastening part (301) of the support in the housing.

2. A unit according to claim 1, wherein the navigation electronic card (320) includes a navigation sensor (321) placed on said card in such a manner to be positioned at the barycenter of the drone (10).

3. A unit according to claim 2, wherein the navigation sensor (321) is an accelerometer.

4. A unit according to claim 1, wherein the battery is fixed to the fastening part by a hook and loop tape.

5. A unit according to claim 1, wherein the absorbing material is a foam of thermosetting material.

6. A unit according to claim 1, wherein the absorbing material mechanical interface is fixed to the housing by bonding.

7. A unit according to claim 1, wherein the absorbing material mechanical interface is fixed to the support by bonding.

8. A rotary wing drone, comprising a unit comprising:
   a navigation electronic card (320) for a rotary wing drone (10); and
   a support (300) for this electronic card, intended to be fixed in a housing (120) provided in the drone,
   the support comprising a mechanical interface with the housing, made of a material absorbing the mechanical vibrations,
   the unit being characterized in that it comprises:
   a fastening part (301) for fixing the support in the housing, said fastening part carrying the mechanical interface (310),
   wherein the mechanical interface is annular in shape and is intended to be attached to a corresponding annular shoulder (121) provided in the housing;
   at least one connection leg (302), carrying the navigation electronic card and mounted free at one end on the fastening part; and
   a battery (400) for the power supply of the drone, accommodated in the support (300) and fixed to the fastening part (301) of the support in the housing.

9. A drone according to claim 8, comprising a magnetic-fixation lid (12) for closing the housing (120).

10. A drone according to claim 8, wherein the navigation electronic card (320) includes a navigation sensor (321) placed on said card in such a manner to be positioned at the barycenter of the drone (10).

11. A drone according to claim 10, wherein the navigation sensor (321) is an accelerometer.

12. A drone according to claim 8, wherein the battery is fixed to the fastening part by a hook and loop tape.

13. A drone according to claim 8, wherein the absorbing material is a foam of thermosetting material.

14. A drone according to claim 8, wherein the absorbing material mechanical interface is fixed to the housing by bonding.

15. A drone according to claim 8, wherein the absorbing material mechanical interface is fixed to the support by bonding.

* * * * *